(12) United States Patent
Huppmann et al.

(10) Patent No.: US 10,686,099 B2
(45) Date of Patent: Jun. 16, 2020

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: Sophia Huppmann, Geldersheim (DE); Simeon Katz, Regensburg (DE); Marcus Zenger, Herrnwahlthann (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/081,402

(22) PCT Filed: Feb. 10, 2017

(86) PCT No.: PCT/EP2017/053015
§ 371 (c)(1),
(2) Date: Aug. 30, 2018

(87) PCT Pub. No.: WO2017/153123
PCT Pub. Date: Sep. 14, 2017

(65) Prior Publication Data
US 2019/0097088 A1 Mar. 28, 2019

(30) Foreign Application Priority Data
Mar. 9, 2016 (DE) .......................... 10 2016 104 280

(51) Int. Cl.
*H01L 33/00* (2010.01)
*H01L 33/38* (2010.01)
(Continued)

(52) U.S. Cl.
CPC ............ *H01L 33/382* (2013.01); *H01L 24/00* (2013.01); *H01L 27/15* (2013.01);
(Continued)

(58) Field of Classification Search
CPC ....... H01L 33/382; H01L 27/15; H01L 33/62; H01L 33/42; H01L 33/0079;
(Continued)

(56) References Cited

U.S. PATENT DOCUMENTS 8,087,962 B2 * 1/2012 Kumagai ............ H01L 51/0004
313/504
8,404,505 B2 * 3/2013 Song ....................... H01L 33/02
438/22
(Continued)

FOREIGN PATENT DOCUMENTS

CN 101393889 A 3/2009
CN 104409465 A 4/2009
(Continued)

OTHER PUBLICATIONS

Office Action dated Aug. 13, 2019 in Japanese Patent Application No. 2018-544099, and English translation thereof.
(Continued)

*Primary Examiner* — Vu A Vu
(74) *Attorney, Agent, or Firm* — Arent Fox LLP (57) ABSTRACT

An optoelectronic device (50) comprising a semiconductor body (10*a*, 10*b*, 10*c*) having an optically active region (12), a carrier (60), and a pair of connection layers (30*a*, 30*b*, 30*c*) having a first connection layer (32) and a second connection layer (34), wherein:
the semiconductor body is disposed on the carrier, the first connection layer is disposed between the semiconductor body and the carrier and is connected to the semiconductor body, the second connection layer is disposed between the first connection layer and the carrier, at least one layer selected from the first connection layer and the second connection layer contains a radiation-permeable and electrically conductive oxide, and the first connection layer and the second connection
(Continued)

layer are directly connected to each other at least in regions in one or more bonding regions, so that the pair of connection layers is involved in the mechanical connection of the semiconductor body to the carrier. A production process is also specified.

20 Claims, 3 Drawing Sheets (51) Int. Cl.
*H01L 33/42* (2010.01)
*H01L 33/62* (2010.01)
*H01L 23/00* (2006.01)
*H01L 27/15* (2006.01)
*H01L 25/075* (2006.01)
*H01L 33/32* (2010.01)

(52) U.S. Cl.
CPC .......... *H01L 33/0079* (2013.01); *H01L 33/42* (2013.01); *H01L 33/62* (2013.01); *H01L 25/0756* (2013.01); *H01L 33/007* (2013.01); *H01L 33/32* (2013.01); *H01L 2224/81013* (2013.01); *H01L 2224/81894* (2013.01); *H01L 2224/81895* (2013.01); *H01L 2224/81896* (2013.01); *H01L 2224/83013* (2013.01); *H01L 2224/83894* (2013.01); *H01L 2224/83895* (2013.01); *H01L 2224/83896* (2013.01); *H01L 2933/0016* (2013.01); *H01L 2933/0066* (2013.01)

(58) Field of Classification Search
CPC .............. H01L 2933/0066; H01L 33/32; H01L 33/007; H01L 2224/81895; H01L 2224/81896; H01L 2933/0016; H01L 2224/83896; H01L 2224/83895; H01L 2224/83894; H01L 2224/83013; H01L 2224/81894; H01L 25/0756; H01L 2224/81013
USPC .......................................................... 257/99
See application file for complete search history.

(56) References Cited

U.S. PATENT DOCUMENTS

| | | |
|---|---|---|
| 8,823,122 B2 * | 9/2014 | Or-Bach ............. H01L 31/0725 257/432 |
| 2002/0030197 A1 | 3/2002 | Sugawara et al. |
| 2004/0135166 A1 | 7/2004 | Yamada et al. |
| 2006/0027820 A1 | 2/2006 | Cao |
| 2007/0010035 A1 | 1/2007 | Liu et al. |
| 2008/0190479 A1 | 8/2008 | Hsieh et al. |
| 2009/0070995 A1 | 3/2009 | Kumagai |
| 2009/0206348 A1 | 8/2009 | Härle et al. |
| 2009/0272989 A1 | 11/2009 | Shum et al. |
| 2010/0051969 A1 | 3/2010 | Ogihara et al. |
| 2010/0051975 A1 | 3/2010 | Suzuki et al. |
| 2010/0283074 A1 | 11/2010 | Kelley et al. |
| 2012/0231572 A1 | 9/2012 | Or-Bach et al. |
| 2013/0069191 A1 | 3/2013 | Or-Bach et al. |
| 2013/0292711 A1 | 11/2013 | Ogihara et al. |
| 2015/0179604 A1 | 6/2015 | Wimplinger |

FOREIGN PATENT DOCUMENTS

| | | |
|---|---|---|
| CN | 101427349 A | 5/2009 |
| CN | 104508809 A | 8/2009 |
| CN | 102593303 A | 7/2012 |
| DE | 102007022947 A1 | 10/2008 |
| DE | 102009020127 A1 | 9/2010 |
| DE | 102009031147 A1 | 1/2011 |
| DE | 102011116232 A1 | 4/2013 |
| JP | 2009-534289 A | 9/2009 |
| JP | 2010-056488 A | 3/2010 |
| JP | 2010-062351 A | 3/2010 |
| JP | 2014-175427 A | 9/2014 |
| WO | 2009/112020 A2 | 9/2009 |

OTHER PUBLICATIONS

Notice to File a Response received in Korean Patent Application No. 10-2018-7029280 dated Oct. 2, 2019.
First Office Action issued in corresponding Chinese Patent Application for Invention No. 2017800116398.X dated Apr. 1, 2020.
Notice of Reasons for Rejection issued in corresponding Japanese Patent Application No. 2018-544044 dated Mar. 31, 2020.

* cited by examiner

OPTOELECTRONIC COMPONENT AND METHOD FOR PRODUCING AN OPTOELECTRONIC COMPONENT

CROSS-REFERENCE TO RELATED APPLICATIONS

This application is the U.S. National Phase under 35 U.S.C. § 371 of International Patent Application No. PCT/EP2017/053015, filed on Feb. 10, 2017, which in turn claims the benefit of German Application No. 10 2016 104 280.3, filed on Mar. 9, 2016, the entire disclosures of which Applications are incorporated by reference herein.

DESCRIPTION

The present disclosure relates to a device, in particular an optoelectronic device. Furthermore, the present disclosure relates to a method for producing a device, in particular an optoelectronic device.

In the production of optoelectronic devices, it is often necessary to assemble individually prefabricated partial elements of the device via a separate joining layer, such as an adhesive layer or a solder layer.

A task to be solved is to specify a new device, preferably an improved device, or a new method, preferably an improved method, for the production of a device.

This task is solved among other things by the subject matters of the independent patent claims, but can also be solved by other objects disclosed herein. Further advantageous embodiments and developments are the subject matter of the dependent patent claims and result from the following description.

According to at least one embodiment, the optoelectronic device is a semiconductor chip, for example a diode chip.

According to at least one embodiment, the optoelectronic device comprises a semiconductor body. The semiconductor body comprises an optically active region. The optically active region can be set up to generate or receive radiation. The device can be a luminescent diode device in particular.

According to at least one further embodiment, the device comprises a carrier. The semiconductor body is preferably arranged on the carrier. The carrier is expediently part of the semiconductor chip.

According to at least one further embodiment, the device comprises a pair of connection layers. The pair of connection layers comprises a first connection layer and a second connection layer. The first connection layer can be arranged between the semiconductor body and the carrier and can be connected to the semiconductor body in particular. The second connection layer can be placed between the first connection layer and the carrier. The second connection layer may be connected to another semiconductor body with an optically active region and/or a carrier which is preferably optically inactive, i.e. not designed to generate or receive radiation. The second connection layer can be directly or indirectly connected to the carrier.

According to at least one embodiment, the first and second connection layers are connected to each other, in particular directly, at least in some regions in one or more connecting regions. In this way, the pair of connection layers can be involved in the mechanical connection of the semiconductor body to the carrier. There may be a single, expediently coherent connecting region, or there may be several, in particular separate, for example non-contiguous, connecting regions. The connection layers are expediently connected directly, i.e. immediately, in the respective connecting region. The connection layers can be connected to each other in certain regions, over a large area or over the entire surface. The connection between the connection layers is expediently mechanically stable, so that a delamination of the semiconductor body from the carrier is avoided.

According to at least one embodiment, the connection layers, especially in the respective connecting region, are connected to each other by direct bonding (often also called wringing). With direct bonding, a separate joining layer between the layers to be connected can be dispensed with. In direct bonding, the mechanical connection between the two connection layers can only be made by mechanical contact between the connection layers. The bonding force can be generated by Van der Waals interaction and/or hydrogen bonds.

According to at least one embodiment, the first connection layer comprises a first interface facing the second connection layer. The second connection layer may comprise a second interface facing the first connection layer. The first and second interfaces preferably adjoin each other at least in the respective connecting region or over the entire surface. The first interface and/or the second interface comprises, preferably at least in the respective connecting region or over a larger area, for example over the entire surface, a roughness which is less than or equal to 1 nm (RMS, RMS: Root Mean Square), preferably less than or equal to 0.5 nm. Such low roughness is particularly advantageous for the direct bonding of two layers.

According to at least one embodiment, one or both of the following layers contain at least one electrically conductive and/or one electrically insulating oxide, for example a metal oxide, a semiconductor oxide or a semiconductor metal oxide: first connection layer, second connection layer. Oxide layers are particularly suitable for direct bonding.

According to at least one embodiment, one or both of the following layers contain a radiation-transmissive and electrically conductive oxide (TCO: Transparent Conducting Oxide): first connection layer, second connection layer. InSnO (often also ITO: indium tin oxides), AlZnO (aluminium zinc oxide), ZnO (zinc oxide), GaInO (galliumindium oxide) are examples of radiation-permeable and electrically conductive oxides. Other TCO materials can also be used.

If the TCO-containing connection layer is bonded directly to the other connection layer, the highly transparent TCO material in the optoelectronic device can be used without a joining layer not only for joining but also for electrical contacting of the optically active region. Direct bonding also reduces the interfaces occurring in the device, which in turn can be advantageous for output efficiency or radiation characteristics, as each interface potentially leads to reflections. Absorbent metal layers in the joining area can also be dispensed with.

A TCO-containing connection layer of the pair of connection layers can be electrically conductively connected to the semiconductor body. The same applies alternatively or additionally to the carrier with which this layer can be electrically conductively connected. Preferably, at least one layer of the first and second connection layer contains a TCO material.

According to at least one embodiment, the first connection layer and/or the second connection layer of the pair of connection layers contains an electrically insulating material, for example an oxide. The electrically insulating material can be a silicon oxide, such as silicon dioxide, or an aluminum oxide, such as Al2O3.

According to at least one embodiment, the first connection layer and/or the second connection layer does not change its composition or does not change it significantly via its extension, i.e. its lateral expansion. Alternatively or additionally, the respective connection layer does not change its composition in the thickness direction. This means that a layer deposited in a single process can be used as the first and/or second connection layer. The first and/or second connection layer may be a flat layer of uniform composition (hereinafter also referred to as a uniform layer).

According to at least one embodiment, the first connection layer and/or the second connection layer is structured and comprises one or a plurality of recesses. The respective recess can extend, preferably in thickness direction, through the respective connection layer. In particular, the respective recess can extend through the entire pair of connection layers. The respective recess can be gas-filled, e.g. filled with air, or comprise a vacuum.

According to at least one embodiment, the first connection layer and/or the second connection layer is embodied as a hybrid layer. A hybrid layer can comprise one or a plurality of electrically conductive sub-regions and one or a plurality of electrically insulating sub-regions. In particular, a hybrid layer can comprise a composition that changes over the lateral direction of extension of the layer. The respective electrically conductive or electrically insulating sub-region can extend in thickness direction through the entire hybrid layer or the pair of connection layers. Preferably, the respective electrically insulating sub-region contains or consists of one of the electrically insulating materials mentioned above. Preferably, the respective electrically conductive sub-region contains or consists of one of the electrically conductive materials mentioned above.

According to at least one embodiment, the first connection layer and/or the second connection layer comprises a plurality of electrically insulated but electrically conductive sub-regions within the respective layer. These sub-regions may contain or consist of a TCO material. The electrically conductive sub-regions can be separate, i.e. non-contiguous, sub-regions of the layer. The same applies to the pair of connection layers. The electrically conductive sub-regions can be electrically insulated from each other by recesses in the respective layer, for example gas-filled or vacuum-filled recesses, or by electrically insulating sub-regions of the layer itself, which is then expediently embodied as a hybrid layer.

The separate electrically conductive sub-regions of the respective connection layer or pair of connection layers can be used for electrical contacting of the device. They can be applied to different electrical potentials, with semiconductor materials of different conductor types (n conductive, p conductive), electrically conductively connected to a semiconductor body on different sides of the optically active region of this semiconductor body and/or different semiconductor bodies of the device. For example, a first sub-region of these electrically conductive but insulated sub-regions may be electrically conductively connected to the semiconductor body of the device on one side of the optically active region and the other may be electrically conductively connected to the semiconductor body on the other side of the optically active region. A short circuit is avoided due to the electrical insulation of the various sub-regions within the respective layer. The respective electrically conductive sub-region can extend in thickness direction through the entire connection layer and in particular through the entire pair of connection layers.

According to at least one embodiment, the device comprises a connection conductor. This extends preferably within the semiconductor body, for example in a recess of the semiconductor body, from one side of the active region of this semiconductor body to the other side of this active region. The connection conductor can extend only partially or completely through the semiconductor body. Within the semiconductor body, the connection conductor is electrically insulated from the active region and preferably from the semiconductor body on at least one side of the active region. On the other side of the active region, the connection conductor can be connected indirectly, for example via an electrically conductive sub-region of a pair of connection layers arranged on this side of the semiconductor body, or directly to the semiconductor body in an electrically conductive manner. Alternatively, the connection conductor can be electrically insulated from the entire semiconductor body, in particular on both sides of the active region. In this case, it extends preferably through the entire semiconductor body and is electrically conductively connected to another semiconductor body on the side facing away from the optically active region.

According to at least one embodiment, a first sub-region of at least two electrically conductive sub-regions of one of the connection layers or the pair of connection layers is electrically conductively connected to the semiconductor body on the side of the active region facing the pair of connection layers, in particular directly. A second sub-region of the at least two sub-regions is preferably electrically conductively connected to the semiconductor body via the connection conductor on the side of the optically active region remote from the pair of connection layers.

According to at least one embodiment, the connection conductor is electrically conductively connected to an electrically conductive sub-region of the first connection layer on the side of the pair of connection layers facing the semiconductor body. This sub-region can be the sub-region which is electrically conductively connected to the semiconductor body or another semiconductor body on the side of the optically active region facing away from the pair of connection layers. Preferably, the area of a contact surface between this electrically conductive sub-region and the connection conductor is smaller than the area of the surface of this electrically conductive sub-region facing the semiconductor body. In other words, the connection conductor can have a smaller surface area than the electrically conductive sub-region of the connection layer that is connected to it. The electrically conductive sub-region of the connection layer is, as explained above, expediently radiation-transmissive. The connection conductor, on the other hand, can be made of metal or at least have metallic properties. Accordingly, it is advantageous to keep the lateral expansion of the connection conductor to a minimum and still make a simplified contact by means of the pair of connection layers due to the larger-area embodiment of the electrically conductive section of the connection conductors. The area of the contact surface between the connection conductor and the conductive sub-region can be less than or equal to $0.25 \times A$, preferably less than or equal to $0.2 \times A$, where A is the area of the electrically conductive sub-region which is electrically conductively connected to the connection conductor in the contact surface. Alternatively or additionally, the area of the contact surface may be greater than or equal to $0.05 \times A$, preferably greater than or equal to $0.1 \times A$.

According to at least one embodiment, the connection conductor extends through the pair of connection layers and is electrically insulated from the pair of connection layers. In this case, no separate conductive sub-region must be provided for contacting the connection conductor. The respective connection layer can simply be embodied as a uniformly composed layer, i.e. not as a hybrid layer. If the layer is embodied as a hybrid layer, the connection conductor can extend through an electrically insulating sub-region of this layer and thus be electrically separated from the rest of the layer. Alternatively, the connection conductor can be electrically insulated from the connection layer and/or the semiconductor body via insulating material that does not belong to the respective connection layer.

According to at least one embodiment, the first connection layer is structured according to the second connection layer. Accordingly, electrically conductive sub-regions of the first and second connection layers can be adjacent and connected to each other. The same applies to electrically insulating sub-regions or recesses of the first or second connection layer.

According to at least one embodiment, the pair of connection layers comprises one or a plurality of electrically conductive sub-regions extending in the thickness direction through the entire pair of connection layers. Advantageously the pair of connection layers also comprises one or a plurality of electrically insulating sub-regions which extend in thickness direction through the entire pair of connection layers. The respective sub-region can be formed by a combination of electrically conductive sub-regions of the first and second connection layer or electrically insulating sub-regions of the second and first connection layer.

According to at least one embodiment, an electrically insulating sub-region of the first connection layer is connected to an electrically insulating sub-region of the second connection layer, in particular directly. Alternatively or additionally, an electrically conductive sub-region of the first connection layer is connected to an electrically conductive sub-region of the second connection layer. Again, alternatively or in addition, an electrically insulating sub-region of one of the connection layers of the pair—the first or second connection layer—is connected to an electrically conductive sub-region of the other connection layer of the pair. The respective connection can be direct. In particular, the respective connection can be created by direct bonding.

According to at least one embodiment, at least one, a randomly selected plurality of or all of the following contiguous pairs of materials are present in a connecting region, the material of the first connection layer being indicated to the left of the slash and that of the second connection layer to the right of the slash:
conductor/insulator,
insulator/conductor,
insulator/insulator, and/or
conductor/conductor.

If the respective layer comprises electrically conductive and/or insulating sub-regions, the above naturally applies accordingly to the sub-regions.

According to at least one embodiment, the pair of connection layers is formed of the following types of layers, the type of the first connection layer being indicated to the left of the slash and that of the second connection layer to the right of the slash:
hybrid layer/hybrid layer
hybrid layer/uniform layer
uniform layer/hybrid layer
uniform layer/uniform layer.

The respective uniform layer can be formed with or without recesses to form separate conductive sub-regions. The respective uniform layer can be made of electrically conductive or electrically insulating material. In the case of two uniform layers, at least one of them is electrically conductive and in particular a TCO layer.

According to at least one embodiment, the device comprises only one or a plurality of separate connecting regions.

According to at least one embodiment, the first and/or second connection layer is continuous or coherent. The respective layer can only be interrupted to pass through the connection conductor.

According to at least one embodiment, the first connection layer and/or the second connection layer is radiation-transmissive. Radiation-transmissive" may be understood in the present disclosure as meaning that the respective layer or the pair of connection layers with these layers comprises a transmittance of X or more for radiation to be received or generated by the device or comprises a transmittance coefficient of greater than or equal to X, where X assumes one of the following values: 0.7, 0.8, 0.85, 0.9, 0.95.

According to at least one embodiment, the semiconductor body is a first semiconductor body and the device comprises one or more further semiconductor bodies. For example, the device comprises a second and third semiconductor body, each with an optically active region. The device can also have further semiconductor bodies. A pair of connection layers is preferably arranged between the respective adjacent semiconductor bodies, which can be arranged one above the other. The pair of connection layers can be embodied as above. Preferably, the respective pair of connection layers is formed by means of two connection layers formed as hybrid layers.

The first and second semiconductor bodies can be electrically conductively connected to each other via the pair of connection layers. For this purpose, an electrically conductive sub-region of the pair of connection layers can connect the two semiconductor bodies together in an electrically conductive manner, e.g. serially. Alternatively, the entire pair of connection layers can be embodied to be electrically conductive over its direction of extension, without a separate electrically conductive sub-region having to be provided. In this case it is advisable to provide a cavity or recess in the pair of connection layers through which a connection conductor can extend (see also below). The number of connection conductors extending into a semiconductor body can be equal to or greater than the number of different semiconductor bodies. The number of connection conductors within the semiconductor bodies of the device can decrease with increasing distance of the respective semiconductor body from the carrier. This means that a semiconductor body that is farther from the carrier can have fewer connection conductors than a semiconductor body that is closer to the carrier.

According to at least one embodiment, a connection conductor extends in the first semiconductor body and is electrically insulated from it within this semiconductor body. This connection conductor can extend through the entire first semiconductor body and is preferably electrically conductively connected to another semiconductor body, for example the second semiconductor body.

According to at least one embodiment, a part of the electrically conductive connection between the connection conductor and further semiconductor body is formed by the pair of connection layers arranged between the semiconductor bodies. Expediently the part is an electrically conductive sub-region of the pair of connection layers. The electrically conductive sub-region can be electrically insulated from one or all remaining electrically conductive sub-regions of the pair of connection layers by an electrically insulating sub-region, for example a circumferential electrically insulating sub-region.

Alternatively or in addition to this, a connection conductor can also extend through the pair of connection layers. In this case, the connection conductor is expediently electrically insulated from an electrically conductive sub-region of the pair of connection layers. For this purpose, for example, an inner wall of a recess in the pair of connection layers may be lined with an insulating material which is only provided after the recess has been formed in the pair of connection layers.

According to at least one embodiment, one or a plurality of electronic elements are integrated in the carrier. The respective electronic element can be used to control one or a plurality of semiconductor bodies of the device. The integration of electronic elements in the carrier is particularly useful if a plurality of semiconductor bodies with one optically active region each are provided.

According to at least one embodiment, the carrier comprises one or a plurality of terminals, for example metallized terminals. The preferred number of terminals is greater than or equal to the number of semiconductor bodies, for example greater than or equal to the number of semiconductor bodies+1.

According to at least one embodiment, the optically active regions of two semiconductor bodies are embodied to generate radiation in different colored spectral regions. This facilitates the generation of mixed-color light, such as white light, by the device. Alternatively, light of the same colour can be produced, which can increase the radiation output generated.

According to at least one embodiment, the pair of connection layers couples the semiconductor body to the carrier as described above or, in the case of a plurality of semiconductor bodies, the semiconductor body closest to the carrier. Alternatively, a separate joining layer, such as an adhesive or solder layer, can be used for the connection to the carrier, so that the connection to the carrier does not necessarily have to take place by means of direct bonding or wafer bonding.

According to at least one embodiment, the respective semiconductor body has grown epitaxially. In particular, the semiconductor body may have grown epitaxially on a growth substrate. The carrier is expediently different from the growth substrate. The growth substrate may have been removed from the respective semiconductor body.

According to at least one embodiment, a thickness of the first connection layer and/or the second connection layer is less than or equal to 20 nm, for example less than or equal to 15 nm or less than or equal to 10 nm. With such coatings, roughness for direct bonding can be easily achieved even when the layers are deposited, without, for example, mechanical post-treatment.

According to at least one embodiment of the method for producing an optoelectronic device, a semiconductor layer sequence with an optically active region is provided. The proposed method is particularly suitable for the production of the devices described above or below, so that features described in connection with the process may also refer to the device and vice versa. The provided semiconductor layer sequence preferably provides semiconductor material for a plurality of semiconductor bodies. For example, it could be a semiconductor wafer. The semiconductor layer sequence can be provided on the growth substrate on which it was epitaxially grown, or on an intermediate carrier that is already different from the growth substrate.

A first connection layer is applied to the semiconductor layer sequence, so that the semiconductor layer sequence and the first connection layer form a first composite.

Furthermore, a composite element is provided. A second connection layer is applied to this composite element so that the composite element and the second connection layer form a second composite.

Subsequently, the first and the second composite can be joined via the first and second connection layers by means of direct bonding, in particular mechanically.

As explained above, at least one layer selected from the first connection layer and the second connection layer preferably contains a radiation-transmissive and electrically conductive oxide.

According to at least one embodiment, the first connection layer and/or the second connection layer is deposited in such a way that its surface has a roughness of less than or equal to 1 nm or less than or equal to 0.5 nm (in each case RMS) immediately after deposition. If a hybrid layer is provided, the electrically conductive material and the electrically insulating material can be deposited separately from one another and, with the aid of appropriate masks and/or structuring steps, the separately deposited materials, can be arranged such that, immediately after the two materials—conductor and insulator—are deposited, a surface forms which has a roughness of less than or equal to 1 nm, preferably less than or equal to 0.5 nm, at least in some areas, in particular in sub-regions provided for the formation of connecting regions, or over the entire surface.

According to at least one embodiment, the first connection layer and/or the second connection layer is planarized after application and before connecting the first and second composites, so that after planarization its surface has a roughness of less than or equal to 1 nm, preferably less than or equal to 0.5 nm. Accordingly, the roughness before planarization may be greater than 1 nm or greater than 0.5 nm and in particular greater than the low roughness required for direct bonding.

According to at least one embodiment, the first and/or second connection layer is subjected to a temperature treatment at a first temperature before the first and second composite are connected. The first temperature can be between 200° C. and 900° C. each inclusive. With the first temperature treatment, the crystal properties of the respective connection layer, in particular a TCO-containing connection layer, can be optimized.

According to at least one embodiment, the first connection layer and/or the second connection layer, preferably after the temperature treatment at the first temperature, is prepared for direct bonding of the first and second composite by an activation treatment, for example by means of a plasma process.

According to at least one embodiment, the first connection layer and the second connection layer are subjected to a temperature treatment at a second temperature after direct bonding. The second temperature is expediently lower than the first temperature. The bond connection can be strengthened by this temperature treatment.

According to at least one embodiment, the composite element is another semiconductor layer sequence with an optically active region, or a carrier element, such as a carrier wafer, which for example comprises material for carriers of a plurality of devices. Structures for electronic elements can already be defined in the carrier (wafer).

The finished composite produced with the method can have a carrier wafer and a plurality of semiconductor layer sequences, each of which is connected via one or a plurality of connection layers, for example pairs of connection layers described at the beginning. Subsequently the composite can be separated into individual chips.

According to at least one embodiment, a recess extending only partially or completely through the semiconductor layer sequence is formed after connecting the semiconductor layer sequences or the semiconductor layer sequence with the carrier element. Insulating material can be introduced into it and connection conductor material can be arranged so that a connection conductor is formed which extends only partially or completely through the semiconductor layer sequence. The connection conductor is preferably provided before the composite with the semiconductor layer sequence is connected to the carrier element. The recess can run completely through the semiconductor layer sequence and completely or only partially through a further semiconductor layer sequence, if necessary connected to it, and completely through a pair of connection layers arranged between the semiconductor layer sequences.

In this variant, therefore, after connecting semiconductor layer sequences via a pair of connection layers, the connection conductor is provided.

According to at least one embodiment, the semiconductor layer sequences to be connected already comprise connection conductors arranged in the semiconductor layer sequences and electrically insulated from the semiconductor material at least in some regions. These connection conductors can be electrically conductively connected to an electrically conductive sub-region in the respective associated connection layer, so that after forming a composite with a first semiconductor layer sequence and a second semiconductor layer sequence, the two connection conductors arranged in these semiconductor layer sequences are electrically conductively connected to one another via a subregion of the pair of connection layers arranged between these semiconductor layer sequences. Accordingly, the pair of connection layers can also be involved in the electrically conductive connection of different semiconductor bodies.

In this variant, the connection conductor is formed in the semiconductor layer sequence before the first and second composites are connected and preferably also before the first connection layer is applied.

Features described in connection with different embodiments can of course be combined with each other, provided they do not contradict each other.

In a preferred embodiment, an optoelectronic device is provided with a semiconductor body comprising an optically active region, further comprising a carrier, and a pair of connection layers comprising a first connection layer and a second connection layer, wherein:
the semiconductor body is arranged on the carrier,
the first connection layer is disposed between the semiconductor body and the carrier and connected to the semiconductor body,
the second connection layer is disposed between the first connection layer and the carrier,
at least one layer selected from the first connection layer and the second connection layer contains a radio-transmissive and electrically conductive oxide, and
the first connection layer and the second connection layer are directly connected to each other at least in regions in one or more connecting regions, so that the pair of connection layers is involved in the mechanical connection of the semiconductor body to the carrier.

BRIEF DESCRIPTION OF THE FIGURES

Further advantages, features and advantageous embodiments result from the following description of the exemplary embodiments in connection with the figures.

Identical, similar and equally acting elements can be provided with identical reference signs. Furthermore, for a better understanding of the objects described here, individual elements may be oversized, so that the representations are not necessarily true to scale.

Figure 1:
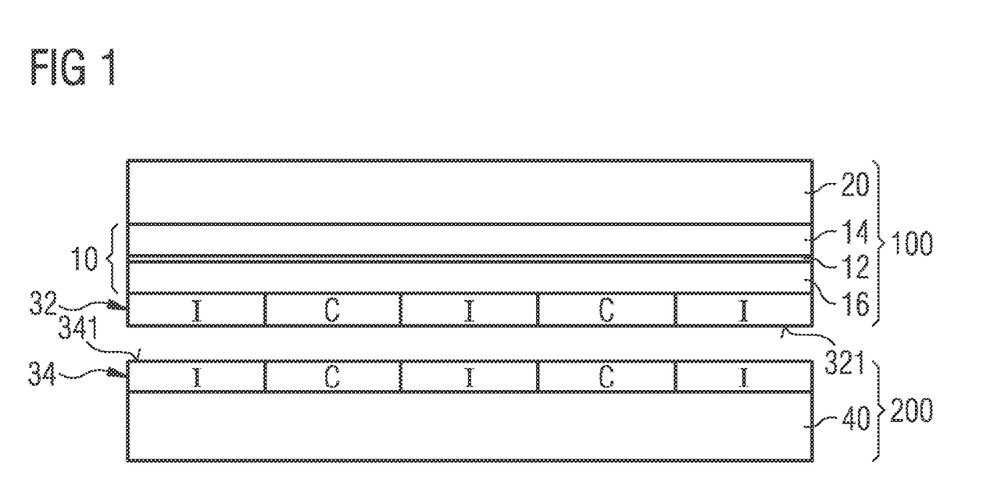
FIG. 1 illustrates an exemplary embodiment of a proposed method using a schematic sectional view.

FIG. 1 illustrates an exemplary embodiment of a proposed method of producing an optoelectronic device using a schematic sectional view. In the proposed method, a first composite 100, preferably a wafer composite, and a second composite 200, preferably a wafer composite, are joined together in a mechanically stable manner. In the method, the composite 100 is bonded mechanically stable to the composite 200 by direct bonding.

The first composite 100 comprises a semiconductor layer sequence 10. The semiconductor layer sequence 10 comprises an active region 12 intended for radiation generation or radiation reception. The active region 12 can be arranged or formed between a first semiconductor layer 14 and a second semiconductor layer 16. The first and second semiconductor layers preferably have different types of conductors (n- or p-conducting). The active region may comprise a heterostructure or a single or multiple quantum well structure. The active region can be intrinsic, i.e. undoped. The semiconductor layer 14 and/or 16 can be doped for the respective type of conductivity. Preferably the active region 12 is embodied for radiation generation, especially preferred for radiation in the visible spectral range. The semiconductor layer sequence is preferably based on III-V semiconductor materials, for example nitride composite semiconductors such as GaN, InGaN, AlGaInN, or AlGaN. Of course, other materials can also be considered.

The semiconductor layer sequence 10 is arranged on a substrate. The substrate 20 may be formed by the growth substrate on which the semiconductor layer sequence 10 has grown epitaxially or may be different from the growth substrate. In the latter case, the growth substrate may have been removed and substrate 20 is an intermediate carrier. Sapphire is a suitable growth substrate for nitride composite semiconductor materials. The substrate 20 expediently stabilizes the semiconductor layer sequence mechanically.

The first composite further comprises a first connection layer 32. This is located on the side of the semiconductor layer sequence 10 remote from the substrate 20.

The second composite 200 comprises a composite element 40. A second connection layer 34 is arranged on the composite element 40. The composite element 40, for example, can comprise a further semiconductor layer sequence with a further optically active region or a carrier element which is provided for a carrier, which is preferably not optically active, of a device produced by the method, for example a semiconductor chip. The respective semiconductor layer sequence preferably provides semiconductor material that is suitable for the formation of semiconductor bodies for a plurality of semiconductor chips to be produced.

The first connection layer 32 and the second connection layer 34 are preferably intended and embodied for bonding to one another via direct bonding, i.e. without a separate joining layer. For this purpose, the layers have interfaces suitable for direct bonding. The first connection layer has a first interface 321. The second connection layer 34 has a second interface 341. The respective interface is preferably turned away from the rest of the associated composite. The first interface 321 and/or the second interface 341 is preferably flat. The interface 321 is turned away from the semiconductor layer sequence 10 and the interface 341 is turned away from the composite element 40. The first composite and the second composite are preferably arranged for direct bonding so that the first interface 321 faces the second interface 341.

The first interface 321 and the second interface 341 are embodied in such a way that it has a roughness of less than or equal to 1 nm RMS (RMS: Root Mean Square) in certain regions, expediently at least in the areas intended for connection by direct bonding or over its entire surface. Preferably the roughness is less than or equal to 0.5 nm RMS. Such roughness is particularly advantageous for a direct bond connection.

In the exemplary embodiment shown, the respective connection layers 32 and 34 are embodied as hybrid layers. A hybrid layer preferably has one or a plurality of electrically conductive sub-regions (C), particularly when viewed from above on the surface facing away from the rest of the composite. These electrically conductive sub-regions are expediently electrically separated from each other within the layer. The respective connection layer 32, 34 may in particular comprise a plurality of conductive sectors when viewed from above. The electrical insulation of the sectors from each other is achieved by one or a plurality of electrically insulating sub-regions (I). The insulating sub-regions are formed by an insulator in a solid, non-gaseous phase. Along their lateral direction of extension, the respective connection layer can have a changing composition when viewed in sectional view. In particular, a conductive area C can be arranged between two insulating sub-regions I. The electrically insulating and electrically conductive sub-regions can have the same thickness and/or different thicknesses. If they have different thicknesses, the thicknesses are still preferably selected such that the interface 321 or 341 of the respective connection layer 32, 34 provided for the direct bond connection is flat or at least meets the above-mentioned roughness requirements.

Connection layers 32 and 34 are preferably structured in such a way that conductive and insulating areas are provided for connection. "Structured accordingly" may mean that electrically conductive and/or electrically insulating sub-regions of the respective connection layer 32 or 34 in the respective composite 100 and 200 respectively have corresponding positions, sizes and/or shapes. Accordingly, conductive regions C assigned to each other and electrically insulating regions I assigned to each other can be directly connected to each other in the direct bonding process. Alternatively or in addition, insulating regions can also connect to conductive regions. This may be the case, for example, in smaller areas, such as when one insulating region of one of the layers is slightly larger laterally than the insulating region of another layer, so that an insulating region of one of the connection layers bonds directly to a conductive and an insulating region of the other connection layer. In any case, it is advantageous if, after the connection, conductive sub-regions C of both layers are connected together to provide an electrically conductive connection between the side facing the semiconductor layer sequence 10 and the side facing away from the semiconductor layer sequence of the pair of connection layers formed by layers 32 and 34 through the pair of connection layers.

The electrically conductive sub-regions C, for example, are formed by means of a radiation-transmissive and electrically conductive oxide, in particular a metal oxide. For example, the following materials are suitable: ITO, AlZnO, ZnO, GaInO. The respective electrically insulating sub-region I, for example, is formed by means of an electrically insulating material, for example an oxide. For example, the following materials are suitable: $SiO_2$, $Al_2O_3$. The materials of the insulating or conductive regions can be the same or different for the different connection layers. Insulating and conductive materials can also vary within a layer, especially between different sub-regions. However, the insulating or conductive sub-regions of a layer are preferably formed by the same material. If different TCO materials are used in different connection layers, these preferably have different contact properties for semiconductor materials of different conductivity types. For example, the conductive sub-regions of the first connection layer 32 may contain a ZnO and the electrically conductive sub-regions of the second connection layer 34 may contain ITO or vice versa. These materials can be characterized by different contact properties to p or n conductive semiconductor materials. Alternatively, the conductive sub-regions of different layers can also contain or consist of the same TCO materials.

As an alternative to the variant shown in FIG. 1 of hybrid layers to be connected directly as connection layers, in which electrical insulation is provided by means of an insulating material I, various electrically separated conductive sub-regions of the respective connection layer 32 or 34 can also be formed by gas-filled or vacuum-containing gaps between two conductive sub-regions. In this case, the insulating sub-regions I of an insulating material shown in FIG. 1 are not present.

Figure 3:
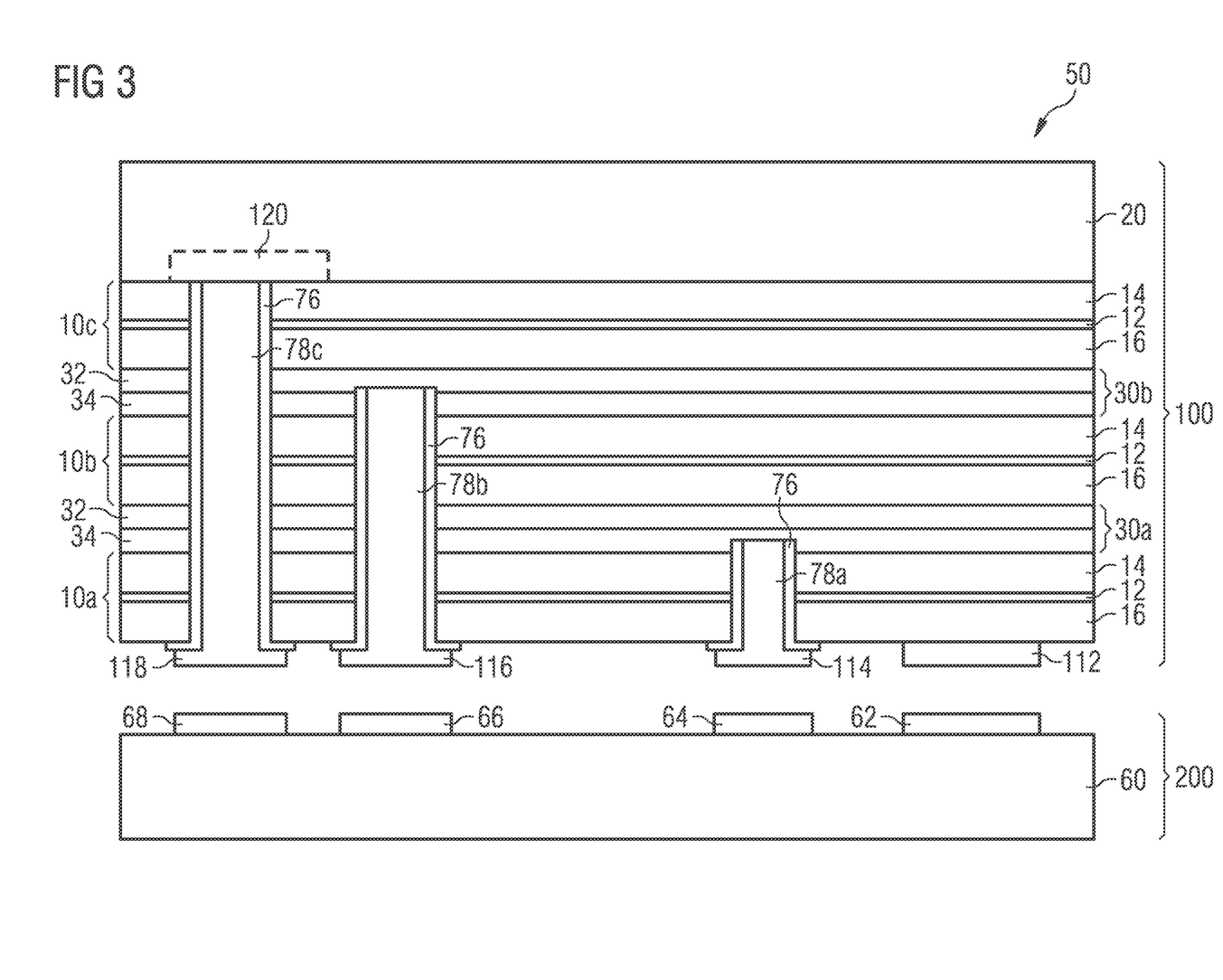
FIG. 3 illustrates an exemplary embodiment of a proposed device using a schematic sectional view.

Furthermore, as an alternative to the hybrid layers shown in FIG. 1, a uniform layer can also be used as the first and/or second connection layer for direct bonding can be used. For example, at least one of the uniform connection layers 32 and 34 contains or consists of or both connection layers contain or consist of a TCO material. Alternatively, at least one of the uniform layers may contain or consist of an insulating material. In contrast to structured layers, uniform layers can be applied over the entire surface. A corresponding exemplary embodiment for such a device is shown in FIG. 3.

A transparent and electrically conductive oxide, for example a metal oxide, can be applied to the semiconductor layer sequence 10 to produce the respective connection layers 32 and 34. For the formation of a uniform layer for direct bonding, the layer can be applied over its entire surface. If structuring in one or more electrically conductive sub-regions is desired, the electrically conductive and transparent material can be deposited over its entire surface and subsequently structured, or it can already be applied in a structured form. An appropriate mask can be used for each structuring step. Sputtering, vapor deposition or an ALD process (ALD: Atomic Layer Deposition) is suitable for the application of the respective radiation-transmissive and electrically conductive oxide. Other deposition processes can also be considered. The insulator or the insulating material, preferably also oxide, for the respective insulating sub-region can be deposited in an appropriate manner. Chemical vapour deposition is also suitable as an alternative or supplementary method for separating the insulating material. The insulating material can be deposited before or after the conductive material.

The roughness of the surface of the connection layer in the region with the respective material—conductor or insulator—intended for the bond connection can already meet the above-mentioned roughness specifications or requirements for direct bonding directly after the material has been deposited, for example due to a corresponding low layer thickness. Alternatively, the roughness suitable for bonding is produced after the material has been applied. This process can be carried out one after the other for electrically insulating and electrically conductive materials or together for electrically insulating and electrically conductive materials. Roughness can be reduced by planarization until it meets the required specifications. Planarization can be carried out by means of polishing, for example chemical mechanical polishing (CMP for short). If the respective connection layer or the respective material is to be deposited with a roughness that is less than or equal to 1.0 nm or even less than or equal to 0.5 nm, the respective deposited material layer preferably has a thickness of less than or equal to 20 nm, for example less than or equal to 15 nm or less than or equal to 10 nm. By means of such small thicknesses, layers with the required low roughness can be deposited in a simplified manner. If the roughness is achieved by planarization or if a corresponding direct deposition is possible, the respective connection layer can of course be thicker.

After the formation of the respective connection layer, a temperature process can be carried out to which the respective connection layer is exposed. This allows the crystal properties, especially of the TCO material, of the respective connection layer to be optimized. The temperature process can be carried out at a first temperature greater than or equal to 200° C. and or less than or equal to 900° C., for example in a gas atmosphere such as oxygen or nitrogen gas atmosphere. After this temperature process, the material of the respective layer, in particular the TCO material and/or the insulating material, can be activated by means of a plasma process, for example a plasma pretreatment. For example, reactive ion etching (RIE), an ICP process (ICP: inductively coupled plasma) or a process with microwave plasma, each with nitrogen gas, oxygen gas and/or Ar-plasma, are suitable. The surface of the respective connection layer can then be cleaned, for example with deionized water or a cleaning material known as Standard Clean 1 (SC1) or Regular Clean 1 (RC1). In the manner described above, the surface of the respective connection layer 32 or 34 can be optimally prepared for the bonding process.

The first composite 100 and the second composite 200 are then moved relative to each other in such a way that the interfaces 341 and 321 are mechanically in contact with each other and, due to the mechanical contact, are mechanically stable connected to each other by direct bonding. After mechanical contact, a further temperature treatment can be carried out to strengthen the bond connection. This is preferably carried out at a temperature lower than the first temperature, for example at a temperature lower than 200° C. After that, the first and second composites are mechanically stable connected. The substrate 20 can subsequently be removed, for example by a laser separation process. On the side with the removed substrate, if desired, a further composite can be bonded to the previously produced composite, in particular by direct bonding.

As already mentioned above, the connection layers 32 and 34 can be embodied accordingly to each other or can be different from each other. For example, layer 34 may be uniform and contain an insulator, such as silica, and layer 32 may be a hybrid layer with electrically insulating regions, such as silica, and electrically conductive regions, such as TCO material.

If the composite element 40 is embodied as a carrier element, it can have a purely supporting function or, for example, comprise integrated electronic devices (see further below). The carrier element can contain or consist of a semiconductor material, for example silicon. Electronic elements can be formed in the carrier element by means of CMOS processes. Electronic elements can be defined in the carrier element by doped regions formed by implantation or diffusion.

The proposed method offers significant advantages. Due to the use of TCO materials, elements of the produced semiconductor device can be electrically contacted by means of the connection layer. If an adjusted alignment of the first and second composite is required, for example for connecting special electrically conductive sub-regions or electrically conductive elements of the composites to be connected, the use of hybrid layers with TCO material reduces the adjustment requirements, since the conductive sub-regions to be connected can be enlarged due to the low absorption in TCO materials and thus a conductive connection of two conductive sub-regions can be achieved during bonding in a simplified manner. Furthermore, when using TCO materials, especially for electrically separated, electrically conductive sub-regions of the connection layers, there are no absorbent materials in the connecting region. If a metal were used instead of the TCO material, the absorption of radiation in the connecting region would be greatly increased compared to TCO materials.

By means of the proposed method, different semiconductor layer sequences 10 can be connected to each other and/or one or a plurality of semiconductor layer sequences already stacked on top of each other can be mechanically stable connected to a carrier element. Devices, in particular semiconductor chips, which can be produced using the proposed method, are explained below using FIGS. 2 and 3. Features explained in connection with FIGS. 2 and 3 can of course also be used for the method and vice versa.

Figure 2:
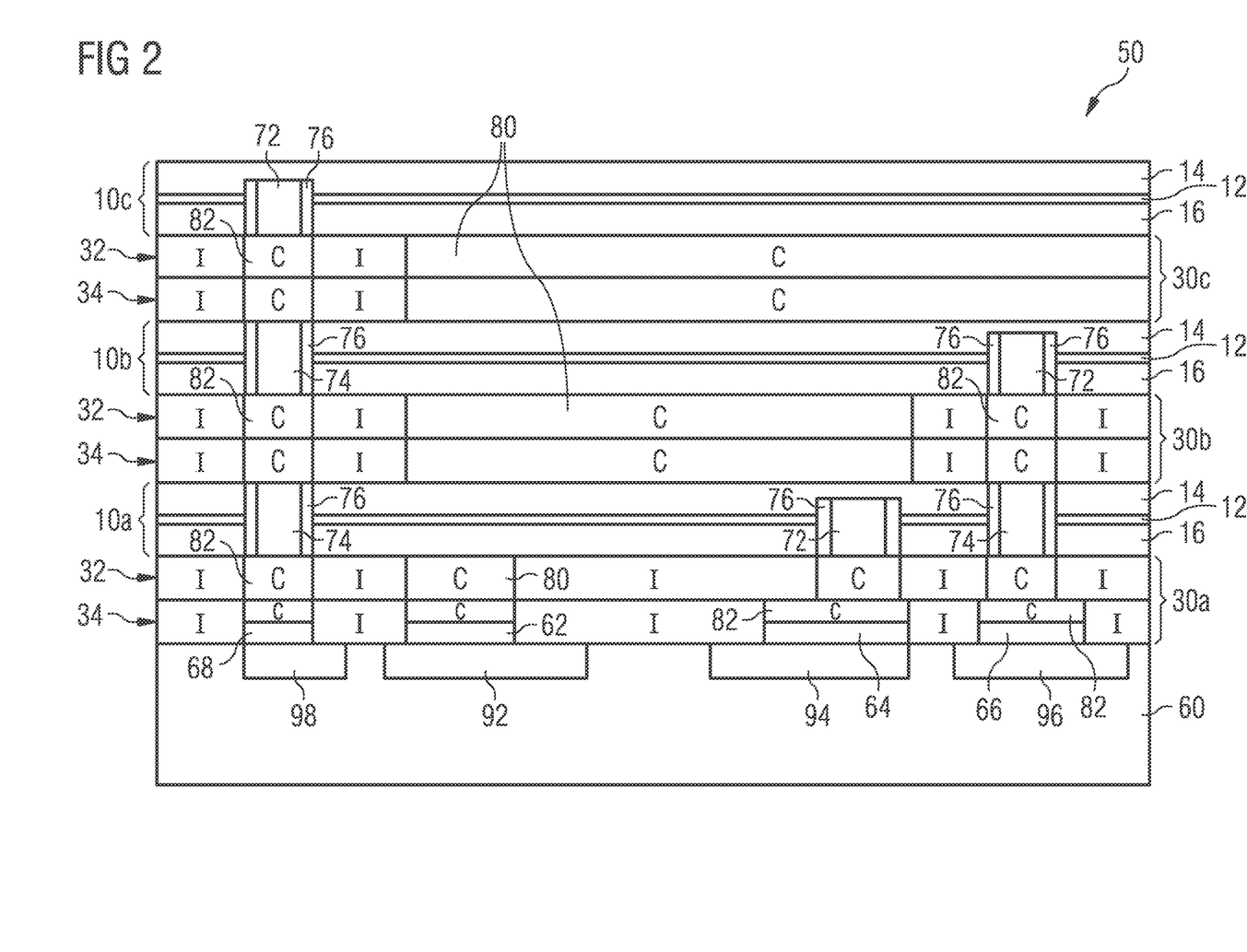
FIG. 2 illustrates an exemplary embodiment of a proposed device using a schematic sectional view.

FIG. 2 shows an exemplary embodiment of an optoelectronic device, in particular a semiconductor chip, using a schematic sectional view. The device 50 comprises a plurality of semiconductor bodies 10a, 10b and 10c. Since these semiconductor bodies may be obtained, for example by separation, from semiconductor layer sequences 10 according to FIG. 1, analog reference signs are used for the devices of the semiconductor layer sequence, such as for the active region 12 and the first and second semiconductor layers 14 and 16 respectively. The semiconductor bodies 10a to 10c are arranged one above the other, wherein a pair of connection layers 30b and 30c respectively are arranged between two adjacent semiconductor bodies. The semiconductor bodies 10a to 10c are arranged one above the other on a carrier 60. Accordingly, they are stacked on top of each other on the carrier. The carrier 60 can have emerged from the composite element 40 of FIG. 1 by separation, which was then embodied as the carrier element. A pair of connection layers 30a is arranged between the semiconductor body 10a next to the carrier and the carrier 60. The pair of connection layers 30a to 30c each contain a first connection layer and a second connection layer, which, as they may be obtained, for example by separation, from connection layers 32 and 34 according to FIG. 1, are provided with corresponding reference signs.

The optically active regions of different semiconductor bodies can be embodied to generate light of different colors, for example in the red, green and blue spectral range. In particular, the device can be embodied to produce mixed-coloured, in particular white, light. Alternatively, two or three of the optically active regions are embodied to generate radiation of the same color. The radiation power generated by the device in the respective spectral range can thus be increased.

The connection layers 32 and 34 of the respective pair of connection layers can be bonded together by direct bonding as described above. The connection layers 32 and 34 of the respective layer pair are formed in the example shown as hybrid layers with electrically insulating sub-regions I and electrically conductive sub-regions C.

The semiconductor layers 14 and 16 of the respective semiconductor bodies 10a to 10c are arranged such that a first semiconductor layer 14 and a second semiconductor layer 16 of adjacent semiconductor bodies face each other. Accordingly, semiconductor layers of different conductivity types face each other, so that the semiconductor bodies themselves are connected in series. The electrically conductive connection is made via the conductive TCO material in electrically conductive sub-regions C of connection layers 32 and 34.

The respective pair of connection layers 30a, 30b and/or 30c preferably comprises at least one or exactly one conductive sub-region 80, which electrically conductively connects layers of different conductor types 14 and 16 of adjacent semiconductor bodies. This sub-region 80 extends through the entire respective pair of connection layers.

The respective pair of connection layers 30a, 30b and/or 30c comprises at least one or a plurality of, for example in the sectional view between two insulating sub-regions I of the pair of connection layers arranged, conductive sub-regions 82. The insulating material I can circulate the sub-region 82 when viewed from above. Compared to sub-region 80, which connects two adjacent semiconductor bodies in an electrically conductive manner, the conductive sub-region 82 can have a smaller surface area when viewed from above. The sub-region 82 is used for electrical through-connection through the respective pair of connection layers and is electrically separated from the sub-region 80 within the pair of layers. A short circuit is thus avoided. The sub-regions 80 and 82 of a layer pair can be electrically conductively connected to the same semiconductor body on different sides of the active region. The pair of connection layers 30a comprises three sub-regions 82. The pair of connection layers 30b comprises two sub-regions 82. The pair of connection layers 30c comprises one sub-region 82. Pairs of layers farther from the carrier therefore have fewer conductive sub-regions 82 than pairs of layers closer to the carrier.

At least one connection conductor is formed in the respective semiconductor bodies 10a, 10b and 10c. Device 50 comprises first type connection conductors 72' and second type connection conductors 74. The first and/or second type 72, 74 connection conductors can already be formed in the respective semiconductor layer sequence if this is provided for the connection by means of direct bonding.

Each semiconductor body 10a to 10c comprises at least one first type connection conductor 72. This extends from one side of the semiconductor body, preferably the side facing the carrier 60, in an electrically insulated manner through the semiconductor body and through the optically active region 12 and is electrically conductively connected to the semiconductor body on the side of the optically active region facing away from the entry side of the connection conductor into the semiconductor body. For example, the respective connection conductor 72 is electrically conductively connected to the semiconductor layer 14 of the respective semiconductor body 10a to 10c. The first type connection conductor 72 is used for electrical contacting of this special semiconductor body. The electrical insulation may be made of electrical insulating material 76, which liners a recess formed in the respective semiconductor body for the connection conductor, which preferably does not extend completely through the respective semiconductor body. The first type connection conductor 72 extends only partially through the semiconductor body. Alternatively, the first type connection conductor 72 can extend through the entire semiconductor body (not shown). On the side of the semiconductor body far from the carrier, the first type connection conductor can then be conductively connected to this semiconductor body. In this case, the respective pair of connection layers may comprise a further electrically insulated conductive sub-region which is not insulated from the semiconductor body like the sub-region 82 but is electrically conductively connected to both the first type connection conductor 72 and the semiconductor body through which this connection conductor extends.

Some semiconductor bodies—in the exemplary embodiment all except the semiconductor body farthest from the carrier 10c—have at least one second type connection conductor 74. The respective connection conductor 74 preferably extends through the entire semiconductor body and is electrically insulated from this semiconductor body, for example again by means of insulating material 76. The second type connection conductor 74 may be designed to electrically contact a semiconductor body of the device other than the one through which it extends. An electrical connection of the respective semiconductor body is made possible via the first type connection conductor 72 in the respective semiconductor body from the carrier side, whereby the second type connection conductors 74 provide the electrical feed-through of the connection for a semiconductor body through other semiconductor bodies closer to the carrier. If the optoelectronic device comprises only one semiconductor body, a second type connection conductor can therefore be dispensed with. The sum of first and second type connection conductors in the semiconductor body 10a nearest to the carrier is expediently determined by the number of semiconductor bodies in the device and preferably equal to the number of semiconductor bodies of the device.

The respective second type connection conductor 74 is preferably electrically conductively connected at least on one side or on both sides of the semiconductor body through which it extends to a conductive sub-region 82 of the pair of connection layers arranged on the respective side of the semiconductor body. Finally, the respective second type connection conductor is electrically conductively connected to a first type connection conductor 72, preferably on its side far from the carrier, for example via one or a plurality of sub-regions 82 and/or a further second type connection conductor 74. In this way, a remote semiconductor body—such as semiconductor body 10b or 10c—can also be electrically contacted on the side of the semiconductor body stack facing the carrier 60. The sub-regions 82 may have a larger surface area than the respective connection conductor 72 and/or 74. The area of the contact surface between the respective connection conductor and the associated conductive sub-region can be less than or equal to $0.25 \times A$, preferably less than or equal to $0.2 \times A$, where A is the area of the electrically conductive sub-region which is electrically conductively connected to the connection conductor in the contact surface. Alternatively or additionally, the area of the contact surface may be greater than or equal to $0.05 \times A$, preferably greater than or equal to $0.1 \times A$. The respective connection conductor 72 or 74 can be metallic. Since the respective conductive sub-region 82 contains TCO material, a larger surface area embodiment is possible without significantly increasing the absorption losses in the device. In other words, the conductive sub-region 82 may have a larger surface area when viewed from above than the recess formed in the respective semiconductor body for the connection conductor to which the sub-region 82 is electrically conductively connected, and may project laterally above this recess in particular. In order to avoid a short circuit, it is advisable to place insulating material between the conductive sub-region 82 and the semiconductor body.

In the exemplary embodiment shown, the first semiconductor layer 14 of the respective semiconductor body facing away from the carrier is electrically connected via one or more connection conductors 72 and/or 74. The second semiconductor layer 16 of the respective semiconductor body facing the carrier is preferably electrically connected via an electrically conductive sub-region 80 of the respective pair of connection layers. The sub-regions 80 of the respective pair of connection layers 30b, 30c connect the semiconductor bodies 10a, 10b and 10c in series.

The carrier 60 comprises a plurality of terminal regions 62, 64, 66, and 68, in particular terminal metallizations. A first terminal region 62 is electrically conductively connected to the second semiconductor layers 16 of the various semiconductor bodies, in particular via the sub-regions 80. A second terminal region 64 of the carrier 60 is electrically conductively connected to the first semiconductor layer 14 of the semiconductor body 10a via the first type connection conductor and an electrically conductive sub-region 82 of the pair of connection layers 30a. The semiconductor body 10a can thus be controlled via the terminal regions 62 and 64. A third terminal region 66 of the carrier 60 is electrically conductively connected to the first semiconductor layer 14 of the semiconductor body 10b, in particular via the second type connection conductor 74 in the first semiconductor body 10a, a conductive sub-region 82 of the layer pair 30b and the first type connection conductor 72 in the semiconductor body 10b. The semiconductor body 10b can thus be controlled via the terminal regions 62 and 66. A fourth terminal region 68 of the carrier 60 is electrically conductively connected to the semiconductor layer 14 of the semiconductor body 10c—in particular via the second type connection conductors 74 in the semiconductor bodies 10a and 10b and the conductive sub-region 82 of the pair of connection layers 30b lying therebetween as well as the first type connection conductor 72 in the semiconductor body 10c and the conductive sub-region 82 of the pair of connection layers 30c arranged between the connection conductors 72 and 74. The semiconductor body 10c can thus be controlled via the terminal regions 62 and 68. The semiconductor bodies 10a to 10c are expediently separate and/or can be controlled independently of each other. The number of individual terminal regions of the carrier can be greater than or equal to the number of semiconductor bodies, in particular greater than or equal to the number of semiconductor bodies plus 1.

Carrier 60 may comprise one or a plurality of electronic elements 92, 94, 96 and 98, in particular for controlling the respective semiconductor body 10a to 10c. For this purpose, the respective terminal region is expediently connected to an electronic element assigned to it in an electrically conductive manner. The electronic elements 92, 94, 96 and 98 can each comprise control electronics and/or control logic for the control of the individual semiconductor bodies. The respective electronic element can contain one or a plurality of amplifiers and/or one or a plurality of transistors.

Alternatively, the carrier cannot assume any electronic function. For example, it can only provide external electrical connections for contacting the device, for example by laterally leading out the terminal regions 62 to 68 or feedthroughs of the terminal regions through the carrier to the side of the carrier facing away from the semiconductor bodies (not explicitly shown).

The connection of the semiconductor body stack to the carrier 60 does not necessarily have to be formed by direct bonding. Connection technology based on a joining layer, such as a solder or adhesive connection, can also be used here.

FIG. 3 illustrates another exemplary embodiment of an optoelectronic device 50. The exemplary embodiment of an optoelectronic device 50 shown in FIG. 3 essentially corresponds to the exemplary embodiment described in connection with FIG. 2. A step in the production process of the device is shown just before the composite 100 is mechanically stable connected to the composite 200 and the device 50 is finished. This connection can be made by direct bonding according to the procedure in FIG. 1 or by a separate joining layer. Accordingly, a pair of connection layers is not (yet) provided between the carrier 60 and the semiconductor body 30a nearest to the carrier. The semiconductor bodies 10a to 10c are again arranged one above the other as in FIG. 2 and electrically conductively connected to one another by pairs of connection layers 30a, 30b arranged between two adjacent semiconductor bodies. In the FIG. 3 the substrate 20 is still present, which can of course be removed after the connection with the carrier 60. In contrast to the exemplary embodiment in FIG. 2, the connection layers 32 and 34 of the respective pair of connection layers are two-dimensional, in particular full-surface and/or continuous, uniform layers. The respective connection layer 32, 34 contains or consists of a TCO material. The connection layers 32 and 34 are in turn connected together by direct bonding. Neighbouring semiconductor bodies are electrically conductively connected to each other via the connection layers. The semiconductor bodies are connected in series via the connection layers.

Contacts 112 to 118 are arranged on the side of the semiconductor body closest to the carrier. A contact is assigned to one of the terminal regions 112 to 118. The respective contacts 112 to 118 are electrically conductively connected to the corresponding terminal region 62 to 68 in the finished device. The respective contact can be formed by a metallization.

The first contact 112 can be electrically conductively connected to all semiconductor bodies via the serial connections through the pairs of connection layers 30a and 30b. It is advisable for contact 112 to contact the second semiconductor layers 16 of the semiconductor bodies. The first semiconductor layers 14 of the respective semiconductor body are contacted via connection conductors 78, which each extend through one, a plurality of or all of the semiconductor bodies. A connection conductor 78a, 78b, 78c assigned to this contact is connected to the respective contacts 114 to 118. Alternatively, a surface of the respective connection conductor facing the carrier can form the contact. The number of connection conductors preferably corresponds to the number of semiconductor bodies. One of the connection conductors, 78a, is electrically conductively connected to the pair of connection layers 30a, preferably directly. The same applies to the connection conductor 78b with regard to the pair of connection layers 30b. The connection conductors 78a and 78b end in the pair of connection layers 30b and 30c respectively. The connection conductor 78c, in turn, is electrically conductively connected to the semiconductor body 10c farthest from the carrier via a terminal contact 120, which can be provided after the removal of substrate 20 and is indicated in dashed lines in the figure. Accordingly, the first semiconductor body can be contacted via contacts 112, 114, the second semiconductor body via contacts 114, 116 and the third semiconductor body via contacts 116, 118. Alternatively or additionally, the third semiconductor body can be electrically contacted via contacts 118, 112, the second semiconductor body via contacts 116, 112 and the first semiconductor body via contacts 114, 112. The connection conductors 78a to 78c each extend through the semiconductor bodies in an electrically insulated manner, for which purpose insulating material 76 is provided as in FIG. 2. Due to the relatively high lateral conductivity of the TCO-containing connection layers compared to semiconductor materials, the pairs of connection layers can also be used for current distribution in the lateral direction because the connection conductors end in the region of the pairs of connection layers. One or more connection conductors extend in an electrically insulated manner through a pair of connection layers, in particular the connection conductors 78c and 78b, so that they are not conductively connected to the pair of connection layers. The connection conductor 78c even extends through two pairs of connection layers and is electrically insulated from both. In this exemplary embodiment, the recesses for the connection conductors are only intended after the semiconductor layer sequence has been arranged one above the other and the direct bonding process. The recesses can then be provided with insulating material and filled with material for the connection conductors.

The priority of the German patent application 10 2016 104 280.3 is claimed, the disclosure of which is incorporated herein by reference.

The invention is not limited by the description based on the exemplary embodiment. Rather, the invention includes each new feature and each combination of features, which includes in particular each combination of features in the patent claims, even if this feature or this combination itself is not explicitly indicated in the patent claims or exemplary embodiments.

LIST OF REFERENCES 10 semiconductor layer sequence
10a, 10b, 10c semiconductor body
12 active region
14 first semiconductor layer
16 second semiconductor layer
20 Substrate
30a, 30b, 30c pair of connection layers
32 first connection layer
34 second connection layer
321 first interface
341 second interface
40 composite element
50 optoelectronic device
60 carrier
62, 64, 66, 68 terminal region
72 first type connection conductor
74 second type connection conductor
76 insulating material
78a, 78b, 78c connection conductor
80, 82 electrically conductive sub-region
92, 94, 96, 98 electronic element
100 first composite
200 second composite
112, 114, 116, 118 contact
120 terminal contact
I insulating sub-region
C conductive sub-region

The invention claimed is:

1. An optoelectronic device with a semiconductor body comprising an optically active region arranged between a first semiconductor layer and a second semiconductor layer, a carrier, and a pair of connection layers comprising a first connection layer and a second connection layer, wherein:
   the semiconductor body is arranged on the carrier,
   the first connection layer is disposed between the semiconductor body and the carrier and connected to the semiconductor body,
   the second connection layer is disposed between the first connection layer and the carrier,
   at least one layer selected from the first connection layer and the second connection layer contains a radiation-transmissive and electrically conductive oxide,
   the first connection layer and the second connection layer are directly connected together at least in regions in one or more connecting regions, so that the pair of connection layers is involved in the mechanical connection of the semiconductor body to the carrier, and
   the first connection layer and/or the second connection layer comprises a plurality of electrically conductive sub-regions electrically insulated from one another within the respective layer, wherein at least two of these sub-regions are electrically conductively connected to the semiconductor body on a first side and a second side of the optically active region, wherein the first side is facing towards the first semiconductor layer and the second side is facing towards the second semiconductor layer.

2. The optoelectronic device according to claim 1,
   all of the following layers contain a radiation-transmissive and electrically conductive oxide: first connection layer, second connection layer; and
   at least one or all of the following layers contain an electrically insulating oxide: first connection layer, second connection layer.

3. The optoelectronic device according to claim 1,
   wherein the electrically conductive sub-regions contain or consist of a TCO material.

4. The optoelectronic device according to claim 1, wherein the device comprises a connection conductor extending within the semiconductor body, and wherein the connection conductor is electrically insulated within the semiconductor body from the active region and on at least one side of the active region also from the semiconductor body.

5. The optoelectronic device according to claim 4, wherein a first sub-region of the at least two electrically conductive sub-regions is electrically conductively connected to the semiconductor body on the side of the active region facing the pair of connection layers and a second sub-region of the at least two sub-region is electrically conductively connected to the semiconductor body via the connection conductor on the side of the optically active region facing away from the pair of connection layers.

6. The optoelectronic device according to claim 4, wherein the connection conductor is electrically conductively connected on the side of the pair of connection layers facing the semiconductor body to an electrically conductive sub-region of the first connection layer, and wherein the area of a contact surface between this electrically conductive sub-region and the connection conductor is smaller than the area of the surface of this electrically conductive sub-region facing the semiconductor body.

7. The optoelectronic device according to claim 4, wherein the connection conductor extends through the pair of connection layers and is electrically insulated from the pair of connection layers.

8. The optoelectronic device according to claim 4, wherein the connection conductor extends through the entire semiconductor body.

9. The optoelectronic device according to claim 1, wherein the first connection layer and/or the second connection layer is structured and comprises one or a plurality of gas-filled recesses, over which at least two electrically conductive sub-regions of the respective connection layer are electrically insulated from one another.

10. The optoelectronic device according to claim 1, wherein the first connection layer and/or the second connection layer is formed as a hybrid layer, and the respective hybrid layer comprises one or a plurality of electrically conductive sub-regions and one or a plurality of electrically insulating sub-regions.

11. The optoelectronic device according to claim 1, wherein the first connection layer and/or the second connection layer does not change the material composition over its extension.

12. The optoelectronic device according to claim 1, wherein in a connecting region there are at least one, an arbitrarily selected plurality of or all of the following adjacent material pairs, wherein the material of the first connection layer is indicated to the left of the slash and that of the second connection layer to the right of the slash:
conductor/insulator,
insulator/conductor,
insulator/insulator, and/or
conductor/conductor.

13. The optoelectronic device according to claim 1, wherein a first interface of the first connection layer and a second interface of the second connection layer adjoin one another in the respective connecting region, wherein the first interface and/or the second interface comprise, at least in the respective connecting region or over a larger area, for example over the entire surface, an RMS roughness which is smaller than or equal to 1 nm.

14. The optoelectronic device according to claim 1, wherein the semiconductor body is a first semiconductor body and the device comprises a second semiconductor body having an optically active region, wherein the pair of connection layers is disposed between the first and second semiconductor body, and wherein the first and second semiconductor body are electrically conductively connected to each other via the pair of connection layers.

15. The optoelectronic device according to claim 14, wherein a connection conductor in the first semiconductor body and within the semiconductor body extends electrically insulated therefrom through the entire first semiconductor body and is electrically conductively connected to the second semiconductor body, wherein a part of the electrically conductive connection between the connection conductor and the second semiconductor body is formed by the pair of connection layers disposed between the semiconductor bodies.

16. The optoelectronic device according to claim 1, wherein one or a plurality of electronic elements for driving the respective semiconductor body of the device is integrated in the carrier.

17. The optoelectronic device according to claim 13, wherein the RMS roughness is smaller than or equal to 0.5 nm.

18. The optoelectronic device according to claim 1, wherein the semiconductor body comprises at least one first type connection conductor, extending through the optically active region.

19. A method for producing an optoelectronic device, comprising the steps of:
a) providing a semiconductor layer sequence having an optically active region;
b) applying a first connection layer to the semiconductor layer sequence so that the semiconductor layer sequence and the first connection layer form a first composite;
c) providing a composite element;
d) applying a second connection layer to the composite element so that the composite element and the second connection layer form a second composite;
e) connecting the first and second composite via the first and second connection layer by direct bonding, wherein at least one layer selected from the first connection layer and the second connection layer contains a radiation-transmissive and electrically conductive oxide, whereby
the first connection layer and/or the second connection layer is subjected to a first temperature treatment at a first temperature after application and before step e), and
the first connection layer and the second connection layer are subjected to a second temperature treatment at a second temperature, which is lower than the first temperature, after the direct bonding in step e).

20. The method according to claim 19, in which the first connection layer and/or the second connection layer is prepared for direct bonding in step e) after the first temperature treatment by means of a plasma process.

* * * * *